(12) United States Patent
Fletcher et al.

(10) Patent No.: US 6,750,689 B2
(45) Date of Patent: Jun. 15, 2004

(54) METHOD AND APPARATUS FOR CORRECTING A CLOCK DUTY CYCLE IN A CLOCK DISTRIBUTION NETWORK

(75) Inventors: Thomas D. Fletcher, Portland, OR (US); Javed S. Barkatullah, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/823,098

(22) Filed: Mar. 29, 2001

(65) Prior Publication Data

US 2002/0140478 A1 Oct. 3, 2002

(51) Int. Cl.[7] .............................................. H03K 3/017
(52) U.S. Cl. ........................ 327/175; 327/155; 327/291
(58) Field of Search ................................ 327/291–293, 327/295, 297, 172–175, 176, 165, 155, 161, 162; 375/371, 362, 256; 365/233, 233.5; 326/93–98; 331/40

(56) References Cited

U.S. PATENT DOCUMENTS

| | | | | |
|---|---|---|---|---|
| 5,008,636 A | * | 4/1991 | Markinson et al. | 331/2 |
| 5,122,679 A | * | 6/1992 | Ishii et al. | 327/147 |
| 5,398,262 A | * | 3/1995 | Ahuja | 327/258 |
| 5,444,407 A | * | 8/1995 | Ganapathy et al. | 327/295 |
| 5,828,250 A | | 10/1998 | Konno | 327/116 |
| 5,852,640 A | * | 12/1998 | Kliza et al. | 327/158 |
| 5,914,996 A | | 6/1999 | Huang | 377/39 |
| 5,964,880 A | | 10/1999 | Liu et al. | 713/401 |

\* cited by examiner

Primary Examiner—Minh Nguyen
(74) Attorney, Agent, or Firm—Cynthia T. Faatz (57) ABSTRACT

A clock duty cycle correction circuit. The duty cycle correction circuit is located at a receiver in a clock distribution network to correct a duty cycle of a distributed clock signal.

17 Claims, 8 Drawing Sheets

METHOD AND APPARATUS FOR CORRECTING A CLOCK DUTY CYCLE IN A CLOCK DISTRIBUTION NETWORK

BACKGROUND

1. Field

An embodiment of the present invention relates to the field of clock signal distribution and more particularly, to correcting a clock duty cycle.

2. Discussion of Related Art

Clock distribution networks are typically used to distribute a clock signal from a phase locked loop (PLL) circuit or other clock generation circuitry, for example, to various points across an integrated circuit chip, such as a microprocessor.

The output clock signal provided by the PLL has a given duty cycle. It is typically desirable to match that duty cycle as closely as possible at the various end points of the clock distribution network across the integrated circuit chip. Additionally, it is desirable to be able to control the duty cycle of the clock signals at the receiving endpoints of the clock distribution network such that operation of the integrated circuit can be as predictable as possible. This is particularly important for high frequency integrated circuits.

Matching the duty cycles of clock signals across a clock distribution network, however, may not be straightforward. As a clock signal is distributed across an integrated circuit chip, its duty cycle tends to get distorted due to variations in temperature, voltage, supply noise and other factors in the distribution path. These variations make it difficult to ensure a particular duty cycle for clock signals at the various receiving points of a clock distribution network. This inability to ensure desired clock signal duty cycles across a clock distribution network may result in a need to provide wider operating margins and thus, compromise potential performance of an integrated circuit chip.

BRIEF DESCRIPTION OF THE DRAWINGS

The present invention is illustrated by way of example and not limitation in the figures of the accompanying drawings in which like references indicate similar elements, and in which.

DETAILED DESCRIPTION

A method and apparatus for correcting a clock duty cycle are described. In the following description, particular types of integrated circuits and circuit configurations are described for purposes of illustration. It will be appreciated, however, that other embodiments are applicable to other types of integrated circuits, and to circuits configured in another manner.

For one embodiment, a duty cycle correction circuit is provided at a receiver in a clock distribution network to correct a duty cycle of a distributed clock signal. The terms receiver, receiving point, receiving endpoint and endpoint are used interchangeably herein to refer, for example, to a location in a clock distribution network at which a distributed clock signal is received and at which a local clock signal may be generated.

Figure 1:
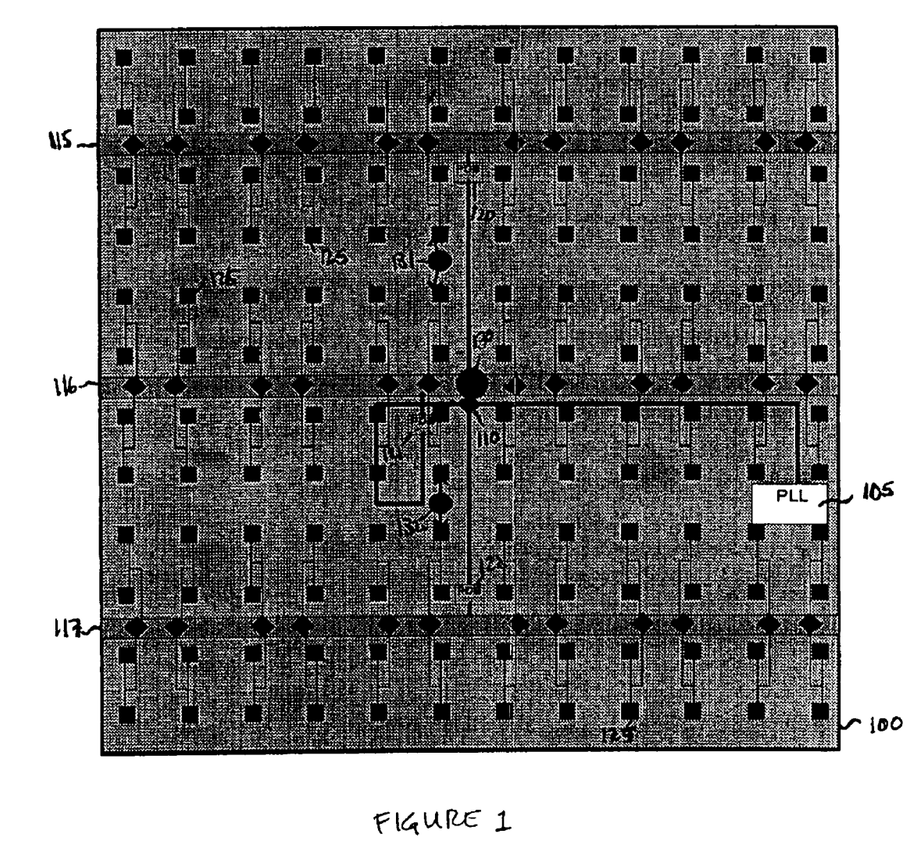
FIG. 1 illustrates an integrated circuit chip that uses a clock distribution network in accordance with one embodiment.

FIG. 1 is a block diagram showing an integrated circuit chip 100 that uses a clock distribution network of one embodiment. For the exemplary embodiment illustrated in FIG. 1, a clock signal is produced by a phase locked loop (PLL) circuit 105 or other clock generation circuitry and provided at its output. The clock signal is then distributed to various receiving points across the integrated circuit chip 100 by a global clock distribution network or other clock distribution circuitry. For the clock distribution network of FIG. 1, for example, the clock signal at the PLL 105 output is provided to a buffer 110 and then to each of three global clock spines 115–117 via programmable delay buffers (PDBs) 120–122.

For the embodiment shown in FIG. 1, the global clock spines 115–117 each implement a binary distribution tree to distribute the clock signal to corresponding final global clock buffers 125. While only a representative few of the final global clock buffers 125 are identified with the reference number 125, it will be appreciated that other final global clock buffers are represented by similar squares in FIG. 1. The final global clock buffers 125 are receiving points in the clock distribution network and are used to provide a local clock signal to nearby circuitry (not shown).

Phase detectors 130–132 are used for one embodiment to provide for dynamic delay adjustment to match the phase of the distributed clock signal between global clock spines 115–117 as closely as possible.

It will be appreciated that, for other embodiments, a different type of clock distribution network configured in a different manner may benefit from various embodiments of duty cycle correction circuits described in more detail below.

As described above, for a typical integrated circuit chip, as the clock signal from the PLL is distributed across the integrated circuit chip, inaccuracies in the duty cycle may result. For example, the clock signal at the PLL output may have a 50% duty cycle. The duty cycles of the distributed clock signal at each of the final global clock buffers may vary from the desired 50% duty cycle due to variations in temperature, devices, supply noise, etc. that are encountered as the clock signal traverses the integrated circuit chip.

For one embodiment, to address this issue, a duty cycle correction circuit is included in some or all of the final global clock buffers 125. By correcting the clock signal duty cycle locally at the final global clock buffers 125, corrections can be made for variations that are introduced by distributing the clock signal from PLL 105. In this manner, the duty cycles of the clock signals at the final global clock buffers 125 may more closely match the duty cycle of the clock signal at the PLL 105 output and/or may be more predictable such that operating margins may be tighter.

Figure 2:
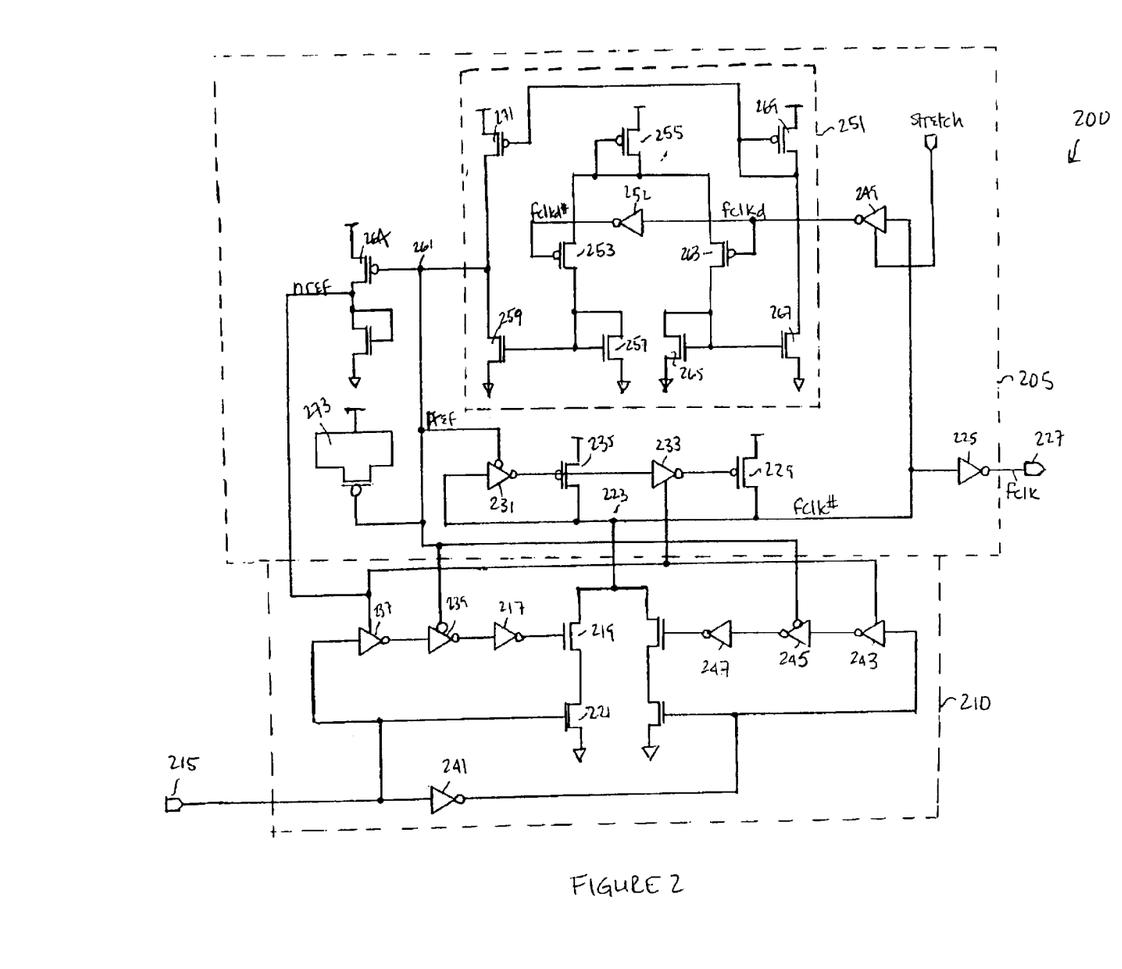
FIG. 2 is a schematic diagram of one embodiment of a frequency doubler and duty cycle correction circuit that may be used in the clock distribution network of FIG. 1.

FIG. 2 is a schematic diagram of a circuit 200 that includes a duty cycle correction circuit 205 of one embodiment that may be used in one or more of the final global clock buffers 125 of FIG. 1, for example. For one embodiment, the circuit 200 of FIG. 2 also includes frequency multiplying circuitry (doubling circuitry in this example) 210 to double the frequency of a clock signal received at an input 215. For another embodiment, a different type of frequency multiplication or frequency dividing circuitry may instead be coupled to duty cycle correction circuitry to provide a different frequency relationship between an input clock signal and a corrected output clock signal.

In operation, when the input clock signal received at the input 215 is low, an output of an inverter 217 will transition high after three inversions such that an n-type transistor 219 is enabled. Because the input clock signal is low, however, transistor 221 is turned off.

As the input clock signal transitions high, the transistor 221 is enabled such that a node 223 is pulled down. (The signal at the node 223 is referred to herein as fclk# for purposes of explanation.) Then, one inversion later (through inverter 225), the final output clock signal (fclk) at an output 227 is pulled high. This assumes that a pull-up transistor 229 was previously turned off.

When the node 223 is pulled low, the fclk# signal transition is also rippled through a reset path including two variable delay inverters 231 and 233 and pull-up transistors 235 and 229. The variable delay inverter 231 is a p-type variable delay inverter while the variable delay inverter 233 is an n-type variable delay inverter.

The reset path operates to control the width of the output pulse at the output node 227. Pulling the node 223 low causes the output of the inverter 231 to go high and the output of the inverter 233 to go low. The low output of the inverter 233 enables the pull-up transistor 229 such that the output signal at the node 227 then transitions low three inversions after it went high. The length of this three inversion delay (and thus, the pulse width of the output signal) depends on the reference voltages supplied to control inputs of the variable delay inverters 231 and 233 as described in more detail below in reference to FIGS. 3 and 4. After another three inversion delay, the high value of fclk# is rippled through the reset path to turn off the pull-up transistor 229 in preparation for the next cycle.

As the reset path is operating to determine the width of the output signal as described above, a first chopper path in the frequency doubling circuit 210 is acting to turn off the transistor 219. The first chopper path includes an inverter 217, an n-type variable delay inverter 237 and a p-type variable delay inverter 239, such that the transistor 219 is disabled to cut off the pull-down path approximately three inversions after it is enabled.

As the clock signal at the input 215 transitions low again, a complementary signal is provided through an inverter 241 to a second chopper path including variable delay inverters 243 and 245 and inverter 247. The second chopper path operates in conjunction with the reset path in a similar manner to the first chopper path to create a second pulse of the fclk signal at the output node 227 in response to a falling edge of the input clock signal. In this manner, two pulses are produced at the output for each input clock cycle such that the frequency of the output clock signal is double that of the input clock signal.

For one embodiment, the inverters in the first and second chopper paths are sized relative to the inverters in the reset path such that the first and second chopper paths are always slightly faster than the reset path. In this manner, contention is avoided at the node 223.

Figure 3:
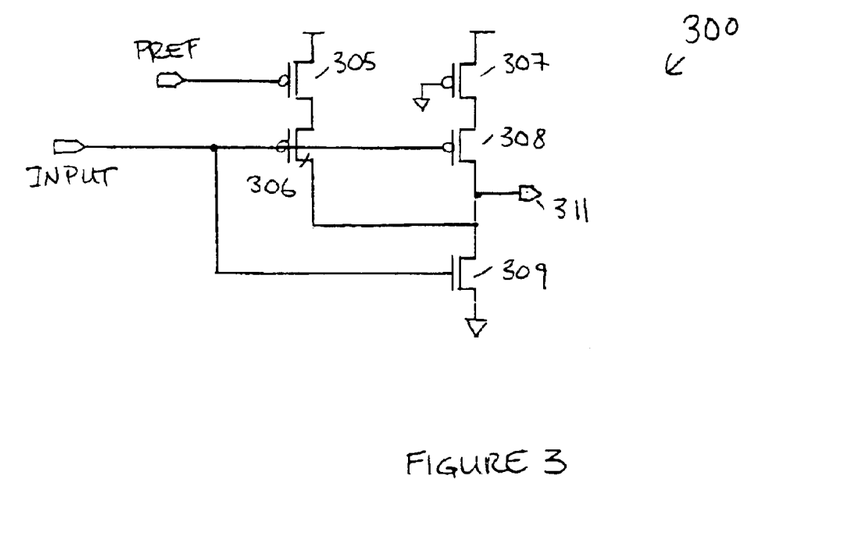
FIGS. 3 and 4 are schematic diagrams illustrating, respectively, p-type and n-type variable delay inverters of one embodiment that may be used in the circuits of FIGS. 2 and 5, for example.
Figure 4:
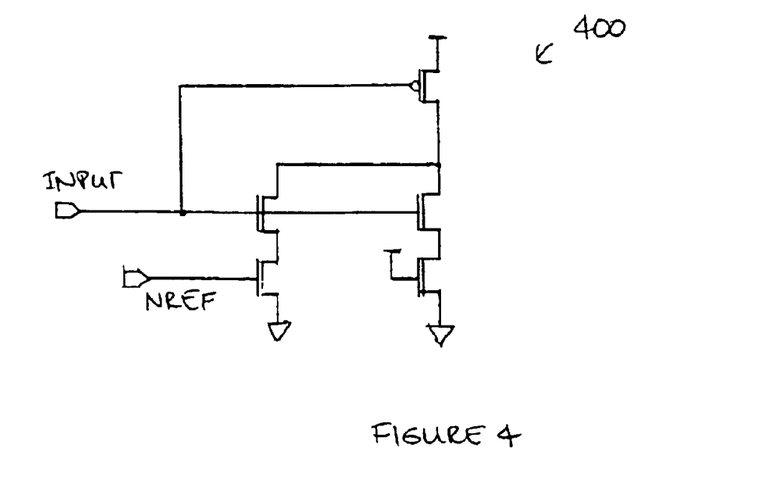

FIGS. 3 and 4 are schematic diagrams illustrating one embodiment of each of the p-type and n-type variable delay inverters, respectively, that may be used in the circuit 200 of FIG. 2 to adjust the delay of the path in which they are included.

Referring first to FIG. 3, the p-type variable delay inverter 300 of one embodiment includes four p-type transistors 305–308 and one n-type transistor 309. The p-type transistor 305 is referred to herein as the delay control transistor and receives a reference voltage (pref in this example) on a control input at its gate.

The p-type transistor 306 is coupled in series between the delay control transistor 305 and the n-type pull-down transistor 309. The p-type transistors 307 and 308 are coupled in series with the n-type transistor 309 and in parallel with the transistors 305 and 306. The p-type transistor 307 has its gate coupled to ground such that it is always on. By using two transistors 307 and 308 in the parallel stack in the configuration shown, it may be possible to make the devices look effectively smaller without having to use a long channel device.

The transistors 307 and 308 are small relative to the transistors 305 and 306. For one embodiment, the delay control transistor 305 is twice the size of the transistor 306 while the transistors 307 and 308 are one fifth the size of the transistor 306. For other embodiments, the relative sizing of the transistors 305–308 may be different.

The p-type transistors 306 and 308 and the n-type transistor 309 all receive a common input signal at their gates. If the variable delay transistor 300 were used to implement the inverter 239 of FIG. 2, for example, each of the transistors 306, 308 and 309 would receive at its gate the output signal from the inverter 237.

In operation, where the common input signal to the transistors 306, 308 and 309 is high, the transistor 309 is enabled and an output node 311 of the variable delay inverter is pulled low. This is the case regardless of the value of the reference voltage (pref) received at the gate of the delay control transistor 305 because the p-type transistor 306 is not enabled.

If, however, the common input signal received at the gates of the transistors 306, 308 and 309 is low, the transistors 306 and 308 are enabled causing the output node 311 to be pulled high. The speed at which the output node 311 is pulled high depends on the value of pref received at the gate of the delay control transistor 305. If pref is high enough such that the delay control transistor 305 is not enabled, the inverter 300 is still operable, but the output node 311 is pulled up relatively slowly by the small p-type transistors 307 (which is always enabled) and 308. In this manner, the delay of the inverter 300 when the transistor 305 is not enabled limits the dynamic range of the circuit 200 such that the pulse width of a signal going through such a variable delay inverter may have a maximum pulse width.

If pref is low enough such that the delay control transistor 305 is partially or fully enabled, pull-up strength is increased and the output node 311 is pulled high faster such that the inverter 300 has a smaller delay. In this case, the closer pref is to ground, the smaller the delay of the variable delay inverter 300. In this manner, the delay through the inverter 300 varies depending on the value of pref.

FIG. 4 is a schematic diagram of an n-type variable delay inverter 400 of one embodiment. The n-type variable delay inverter 400 is configured in and operates in a similar, but complementary manner to the p-type variable delay inverter 300 of FIG. 3. The delay of the n-type variable delay inverter 400 in response to a positive input voltage depends on the value of a different reference voltage referred to herein as nref.

For other embodiments, other types of variable delay inverter configurations may be used. Further, for other embodiments, a different type of variable delay element that may be controlled by one or more signals generated via a feedback path in a duty cycle correction circuit may be used.

Referring back to FIG. 2, the reset path includes one p-type variable delay inverter 231 and one n-type variable delay inverter 233. The first and second chopper paths each also include one n-type variable delay inverter 237 and 243, respectively, and one p-type variable delay inverter 239 and 245, respectively. Each of the variable delay inverters of FIG. 2 may be configured in and operate in a similar manner to the corresponding variable delay inverters of FIGS. 3 and 4.

As mentioned above, the delays of the respective paths vary depending on the value of the reference voltages pref and nref supplied to control inputs of variable delay inverters in each of the paths. The values of pref and nref vary in the manner described below to control the delay through the various paths.

With continuing reference to FIG. 2, the fclk# signal, as well as being provided to the output node 227 through the inverter 225, is also provided through an inverter 249 to a differential sense amplifier (sense amp) 251. This path is referred to herein as the feedback path.

For the embodiment shown in FIG. 2, the differential sense amp 251 is configured such that the threshold of the sense amp 251 is substantially at the Vcc/2 point. In this manner, as described in more detail below, the clock duty cycle is corrected to be substantially a 50% duty cycle.

For one embodiment, to set the threshold of the sense amp 251 at the Vcc/2 point, the two legs of the sense amp 251 including corresponding devices are substantially symmetrical. Further, the relative sizes of some of the transistors of the sense amp 251 are selected to facilitate setting the sense amp 251 threshold at the Vcc/2 point.

For example, for one embodiment, the transistor 255 is 4 microns wide and has a 1 micron channel length (represented herein as 4/1) while each of the transistors 257 and 265 are 1/1 transistors. This relative sizing works well to set the threshold of the sense amp 251 at the Vcc/2 point because the mobility of NMOS transistors is higher than that of PMOS transistors. As described in more detail below, the current is switched back and forth between the two legs of the differential sense amp 251 as the signal fclk# goes up and down. Thus, the total current in the transistor 255 should match the sum of the currents between the two transistors 257 and 265 in order to set the threshold at Vcc/2.

Also for this exemplary embodiment, the p-type transistors 253 and 263 are 7 microns wide and have a short channel length. These transistors are sized such that they are big enough not to contribute to mismatch, while having a short channel length such that their resistance is small compared to the transistors 255, 257 and 265.

The sense amp 251 also provides the ability to reject capacitively coupled noise spikes at the sense amp 251 inputs and provides good common mode rejection. During switching of each of the two PMOS devices 253 and 263 on the inputs of the sense amp 251, there is a coupling between the gate and the drain that can cause a glitch to propagate. By using long channel devices with relatively high capacitance for the NMOS devices 256, 265, 259 and 267 that are current sources, this glitch can be reduced. Further, by using the long channel devices, current is reduced and stability of the circuit is improved by reducing the switching speed.

For other embodiments, the sizes of the transistors may be different. For example, for another embodiment, the transistor 255 may be a 5/1 transistor and the transistors 253 and 263 may be 5 microns wide. It will be appreciated that the transistor sizes provided herein are merely exemplary and that other transistor sizes and relative sizes are within the scope of various embodiments.

With continuing reference to FIG. 2, as fclk# goes low, the signal (fclkd) at the output of the inverter 249 goes high and the signal (fclkd#) at the output of an inverter 252 goes low. In response to fclkd# going low, a p-type transistor 253 is turned on. Turning on the transistor 253 causes current from a p-type current source 255 to be steered down through the side of the sense amp 251 that includes the transistor 253. Due to the current mirror configuration of transistors 257 and 259, the same current is then mirrored through transistors 257 and 259 as they are turned on response to the transistor 253 being turned on. Turning on the transistor 259 causes the node 261 to be pulled low and thus, a pref reference signal to go low.

The pref signal is then provided to the p-type variable delay inverter 231 in the reset path. As described above, when the pref signal is low, the delay through p-type variable delay inverters is shortened. Shortening the delay through the variable delay inverter 231 in the reset path shortens the time that the fclk# signal is low. As the flck# signal is low for a shorter time, the voltage of pref in response to the low fclk# signal becomes higher. In this manner, the delay through the p-type variable delay inverter 231 increases, thereby increasing the time that the fclk# signal is low.

Thus, if the fclk# signal is low a larger percentage of the time than it is high, then pref will tend to drift low and shorten the amount of time that the fclk# signal is low. Similarly, if the fclk# signal is high more than half of the clock cycle, then pref will tend to drift high and lengthen the delay through the reset path. In this manner, timing is averaged in the feedback path through the sense amp 251 to adjust pref such that the time the fclk# signal is low is equal to the time the fclk# signal is high to provide a 50% duty cycle output clock signal.

As pref is pulled low in response to fclk# going low as described above, a p-type transistor 263 is enabled to pull the n-type reference voltage nref high. A high nref value decreases the delay through n-type variable delay inverter 233 in the reset path thereby shortening the delay through the inverter 233. By using a second reference voltage coupled to complementary variable delay inverters for some embodiments, the dynamic range of delay variation in the circuit 200 is increased as compared to using, for example, only p-type variable delay inverters. For other embodiments, only p-type variable delay inverters are included and the nref reference voltage is not generated.

When fclk# is high, the output of the inverter 249 is low such that transistors 263, 265, 267 and 269 in the other leg of the sense amp 251 are turned on. Turning on transistor 267 also enables a transistor 271 having one terminal coupled to the node 261 such that pref is pulled high. Thus, when fclk# is high, pref is also pulled high.

For some embodiments, a capacitive load 273 is coupled to the node 261 to slow down the transition of the pref signal. In this manner, stability of the feedback path is controlled to prevent oscillation. By using the capacitive load 273, for one embodiment, feedback may be slowed down to the point that it may take several cycles to correct the duty cycle to achieve a 50% duty cycle on the fclk output signal.

Also, for some embodiments, the inverter 249 is a variable delay inverter having a delay control input coupled to receive a stretch input signal. The stretch input signal is a control signal that may be varied to control the delay through the inverter 249, and thus, the delay through the feedback path of the circuit 200. In this manner, the duty cycle of the output clock signal fclk can be fine-tuned or adjusted to provide a different duty cycle.

The stretch input signal may be coupled to, for example, a programmable control register, programmable fuse(s), or may otherwise be controllable to provide this adjustment capability. For other embodiments, the inverter 249 is a conventional inverter.

In the manner described above, the circuit 200 can be used in one or more of the final global clock buffers 125 of FIG. 1, for example, to adjust the duty cycle of a clock signal received via a clock distribution network. For this example, the input clock signal received at the input 215 is referred to as a distributed clock signal and the output clock signal is referred to as the corrected clock signal or corrected output clock signal. By adjusting the duty cycle of a clock signal at a receiving point of a clock distribution network, variations in the duty cycle due to variations across the integrated circuit chip can be adjusted out before providing an output local clock signal such as the fclk signal at the output of the circuit 200.

Figure 5:
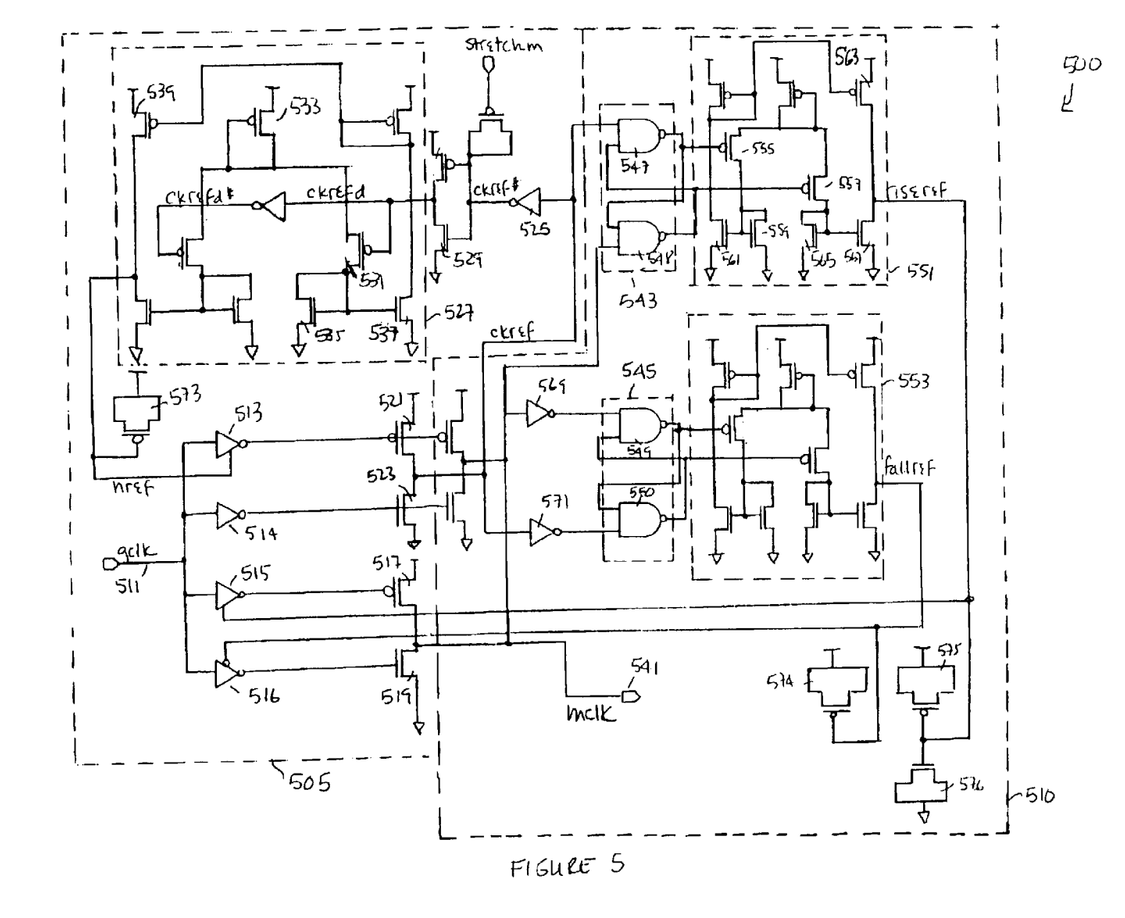
FIG. 5 is a schematic diagram of one embodiment of a duty cycle correction circuit and a smart buffer circuit that may be used in the clock distribution network of FIG. 1.

FIG. 5 is a schematic diagram of circuit 500 including a duty cycle correction circuit 505 of another embodiment. For the duty cycle correction circuit 505, the frequency of the output signal is the same as the frequency of the input signal. The circuit 500 may also be included in one or more of the final global clock buffers 125 of FIG. 1 to adjust the duty cycle of a global clock signal at an endpoint of a clock distribution network. For one embodiment, the circuit 500 also includes a smart buffer circuit 510, but may be used without the smart buffer circuit for other embodiments.

In operation, an input clock signal gclk (e.g. a clock signal received over a clock distribution network) is received at an input 511 and provided to each of four inverters 513–516. For the embodiment shown in FIG. 5, the inverters 513 and 515 are both n-type variable delay inverters while the inverter 516 is a p-type variable delay inverter. The variable delay inverters 513, 515 and/or 516 may be similar in configuration and operation to the corresponding variable delay inverter of FIG. 3 or FIG. 4.

An output clock signal mclk is pulled high by transistor 517 if the output of the inverter 515 is low or pulled low by transistor 519 if the output of the inverter 516 is high. For the embodiment shown in FIG. 5, the delay control inputs to the variable delay inverters 515 and 516 are provided at outputs from the smart buffer circuit 510 as described in more detail below. For other embodiments, delay control signals may be provided through a feedback path more similar to that described above in reference to FIG. 2.

Similarly, a reference clock signal ckref is pulled high by a transistor 521 if the output of the inverter 513 is low or pulled low by a transistor 523 if the output of the inverter 514 is high. Like the fclk# signal of FIG. 2, the ckref signal is fed back on a feedback path through an inverter 525 and a sense amp 527 that is similar in configuration, design considerations and operation to the sense amp 251 of FIG. 2.

When the input clock signal gclk transitions low, ckref transitions low approximately two inversions later. The delay of these two inversions, however, is determined by the value of the reference signal nref at a control input of the variable delay inverter 513.

A low ckref signal causes the ckref# signal at an output of the inverter 525 to transition to a high level to enable the pull-down transistor 529. A signal ckrefd then transitions low to enable a p-type transistor 531. Turning on the transistor 531 causes current from a p-type current source 533 to be steered down through the side of the sense amp 527 that includes the transistor 531. Due to the current mirror configuration of transistors 535 and 537, the same current will then go through transistors 535 and 537 as they are turned on response to the transistors 531 and 533 being turned on. Turning on the transistor 537 causes a transistor 539 to be enabled and thus, an nref signal to be pulled high.

The nref signal is then provided to the n-type variable delay inverter 513 in the output path. As described above, when the nref signal is high, the delay through n-type variable delay inverters is shortened. Shortening the delay through the variable delay inverter 513 shortens the time that the ckref signal is low. As the ckref signal is low for a shorter time, the voltage of nref in response to the low ckref signal becomes lower because there is less time for the ckref signal to transition to a logic high value. As a result of the lower ckref signal, the delay through the n-type variable delay inverter 513 increases, thereby increasing the time that the ckref signal is low. As for the circuit 200 of FIG. 2, timing is averaged in the feedback path through the sense amp 527 to adjust nref such that the time the ckref signal is low is equal to the time the ckref signal is high. In this manner, a 50% duty cycle is provided at the output of the inverter that includes the transistor 521.

Where the duty cycle correction circuit 505 is used without the smart buffer circuit 510, the output of the inverter that includes the transistor 521 is the corrected clock output signal that may be provided to nearby circuitry as a local clock signal. For some embodiments, however, the duty cycle correction circuit 505 is used in conjunction with a smart buffer circuit such as the smart buffer circuit 510 to help to control the timing of the output clock signal (mclk in this example), which is provided at an output node 541.

Smart buffer, as the term is used herein, refers to a circuit that provides for substantially consistent delay of an output signal over a range of output load values.

Figure 8:
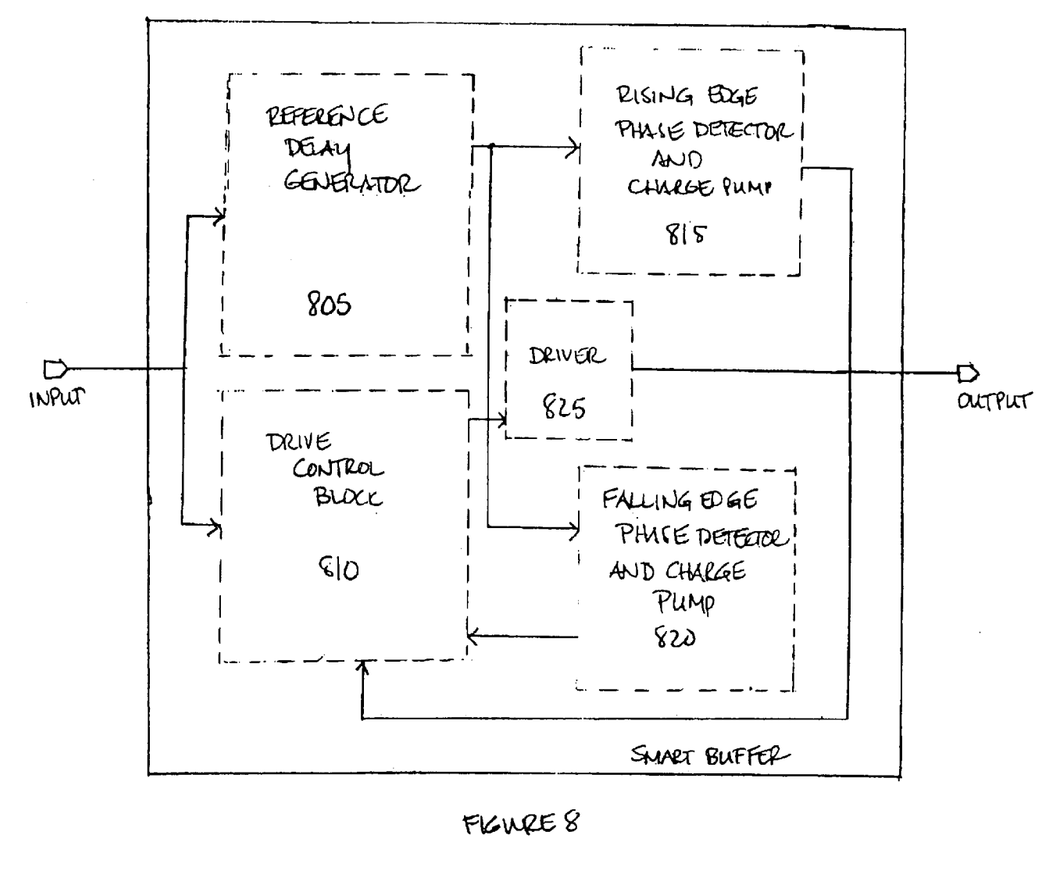
FIG. 8 is a block diagram of a smart buffer circuit in accordance with one embodiment.

FIG. 8 is a block diagram of an exemplary smart buffer circuit 800 in accordance with one embodiment. The smart buffer circuit 800 includes a reference delay generator 805, a drive control block 810, a rising edge phase detector and charge pump 815, a falling edge phase detector and charge pump 820 and a driver circuit 825.

Figure 9:
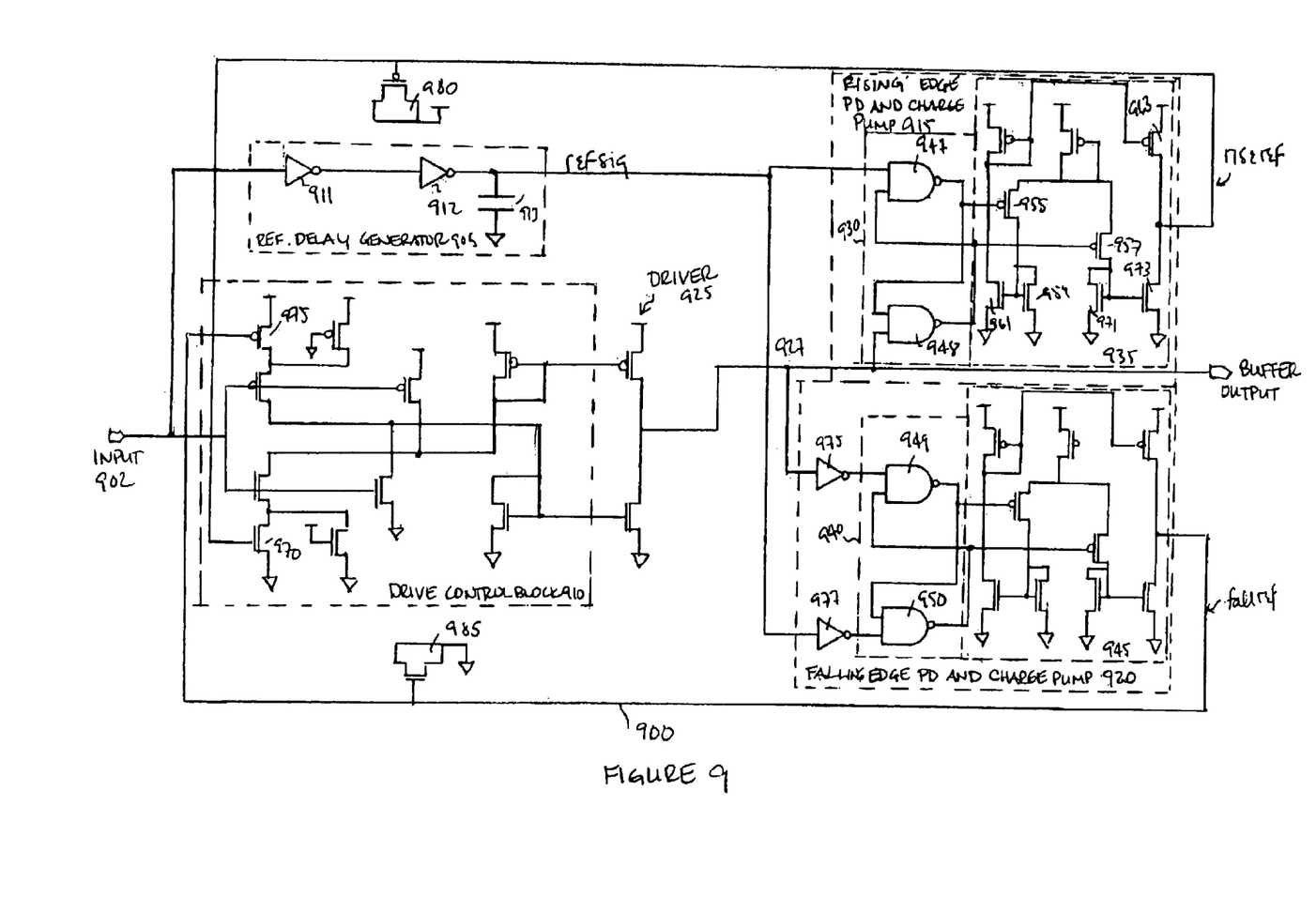
FIG. 9 is a schematic diagram illustrating one embodiment of a smart buffer circuit.

Referring to FIG. 9, an exemplary smart buffer circuit is described in more detail. An input signal, which may, for example, be a clock signal, an input/output signal or other signal, is received at an input 902 to the smart buffer circuit 900 and provided to both the reference delay generator 905 and the drive control block 910. In the reference delay generator 905, the input signal is communicated through inverters 911 and 912 to produce a reference signal (refsig) that is provided to each of a rising edge phase detector and charge pump 915 and a falling edge phase detector and charge pump 920.

A capacitor 913 is coupled to the output of the inverter 912 to control the delay of the reference signal. For one embodiment, the value of the capacitor 913 is selected through simulation, wherein the capacitance that provides the desired delay for the reference signal is selected.

Each of the rising and falling edge phase detectors and charge pumps 915 and 920 also receives a buffer output signal from the drive control block 910 through a driver 925 at the node 927. The rising edge phase detector and charge pump 915 includes a phase detector 930 and a differential sense amp 935 that also acts as a charge pump, while the falling edge phase detector and charge pump 920 includes a corresponding phase detector 940 and differential sense amp 945. Each of the differential sense amps 935 and 945 may be similar in configuration, design considerations and operation to the sense amp 251 of FIG. 2.

Each of the rising and falling edge phase detectors 930 and 940 includes two cross-coupled NAND gates 947 and 948, and 949 and 950, respectively. For one embodiment, the four NAND gates 947–950 are symmetrical, i.e. they are all sized, oriented, etc. to be as close to identical as possible. The phase detector 930 compares rising edges of the refsig signal to rising edges of the buffer output signal while the phase detector 940 compares falling edges of the same signals.

In operation, referring first to the phase detector 930 for purposes of example, where both refsig and buffer output signals start out low, the outputs of both NAND gates 947 and 948 are high such that p-type transistors 955 and 957 are shut off. In this manner, there is no current flowing on either side of the sense amp 935 to switch an output rising reference control signal riseref while both refsig and buffer output signals are low.

If a rising edge of the refsig signal arrives slightly before a rising edge of the buffer output signal, then the output of the NAND gate 947 is pulled low and the p-type transistor 95 is enabled. Enabling the transistor 955 causes current to be steered to the side of the sense amp 935 including the transistor 955 and causes transistors 959, 961 and 963 to be enabled. Turning on transistor 963 causes the riseref signal to be pulled higher.

The riseref signal is provided to a control input of the drive control block 910 at the gate of an n-type transistor 970. The magnitude of the riseref signal determines the extent to which the transistor 970 is turned on. The drive control block 910 of one embodiment operates in a similar manner to a parallel combination of a p-type variable delay inverter and an n-type variable delay inverter described in connection with FIGS. 3 and 4 to control the drive strength, and thus, delay of the resulting buffer output signal. A high riseref signal shortens the delay of the buffer output signal through the drive control block 910 for high input signals such that the buffer output signal delay is decreased to more closely match that of the refsig signal. This behavior of the circuit 900 continues until, at some point, the delay of the buffer output signal to the phase detector 930 may actually be less than that of the refsig signal.

If a rising edge of the buffer output signal is received at the phase detector 930 before a rising edge of the refsig signal, the output of the NAND gate 948 is pulled low to enable the p-type transistor 957. Enabling the p-type transistor 957 steers current through the side of the sense amp 935 that includes the transistor 957 and causes transistors 971 and 973 to be enabled. When the transistor 973 is enabled, the riseref signal is pulled lower such that the delay through the drive control block 910 for high input signals is increased. Increasing the delay through the drive control block increases the delay of the rising edge of the buffer output signal such that it more closely matches the delay of the reference signal refsig.

The delays of the falling edges of the output buffer and refsig signals are matched in a similar manner by the falling edge phase detector and charge pump 920, which receives complementary forms of the refsig and buffer output signals through inverters 975 and 977. An output of the sense amp 945 then provides a fallref reference control signal that is received at a control transistor 975 and used to control the delay through the drive control block 910 for low input signals in a similar manner. Thus, the drive strength of the driver 925 is controlled by controlling delays in the drive control block 910 while the driver 925 maintains a fixed number of devices.

Capacitors 980 and 985 may be coupled to the signal lines that carry the riseref and fallref signals, respectively, for one embodiment, to control the rate at which the riseref and fallref signals may change. In this manner, the capacitors 980 and 985 may prevent oscillation of the riseref and fallref signals, respectively.

Also, for one embodiment, because the reference delay generator 905 does not drive any load, larger devices that are less sensitive to within-die variations may be used. In this manner, the delay through the reference delay generator 905 may be more predictable even with variations in temperature, voltage, etc. For some embodiments, to further enhance the predictability of the delay through the reference delay generator circuit 905, the reference delay generator circuit 905 may be coupled to a filtered or more controlled power supply.

While the exemplary smart buffer circuits described herein adjust both rising and falling edges of a signal to match a reference signal, for other embodiments, a smart buffer circuit may adjust only one edge of a signal (i.e. either rising edges or falling edges).

The smart buffer circuit of some embodiments is therefore an independent circuit (i.e. the circuit does not require any external input control signals or provide any output control signals) that provides for proper delay of a given signal such as, for example, a clock signal, even with output load variations. In other words, the smart buffer circuit automatically corrects an output signal in reference to a target delay. For one embodiment, for example, the smart buffer circuit 900 is capable of correcting a signal for load variations of 3–5×. For other embodiments, the smart buffer circuit may be capable of correcting for a different range of load values.

This ability to correct for output load variations can be helpful where, for example, surrounding circuitry is still being designed and the final load on the circuit is unknown or not finalized. Using the smart buffer circuit of various embodiments can therefore save design time and resources by avoiding the need to make adjustments to the timing of a circuit to which it is coupled when the final load represented by surrounding circuitry is determined. Where the smart buffer circuit is used as described above, for example, as the final load changes with the progress of chip design, substantial retuning effort for the global clock distribution may be eliminated.

Referring back to FIG. 5, the smart buffer circuit 510 operates in a similar manner to the smart buffer circuit 900 of FIG. 9 to match the delay between the ckref signal and the mclk signal. Where the smart buffer circuit 510 is used with the duty cycle correction circuit 505, the corrected output clock signal (mclk) is provided at an output of the inverter that includes the transistors 517 and 519.

For the circuit 510, the reference delay generator described above is combined with duty cycle correction circuitry in the path between the inverter 525 and the output of the inverter including the transistors 521 and 523, the variable delay inverters 515 and 516 correspond to the drive control block of FIGS. 8 and 9, and the inverter including the transistors 517 and 519 corresponds to the driver circuit. Phase detectors 543 and 545 and sense amps 551 and 553 correspond to similar circuitry discussed above in conjunction with FIGS. 8 and 9. Using the smart buffer circuit 510, the output mclk signal delay is substantially consistent over a range of output load values providing the advantages discussed above.

For one embodiment, a stretchm control signal, similar to the stretch control signal described with reference to FIG. 2, is received to vary the delay through the feedback path in the duty cycle correction circuit 505.

Further, only a single reference signal nref is used in the duty cycle correction circuit 505 of FIG. 5 such that the correction range may be smaller than that of the duty cycle correction circuit 205 of FIG. 2. While the dynamic range of delay adjustment may be smaller, however, the delay between the input clock signal and the output clock signal is also smaller. For other embodiments, a pref signal may also be generated by the duty cycle correction circuit to provide for a wider dynamic delay range.

Figure 6:
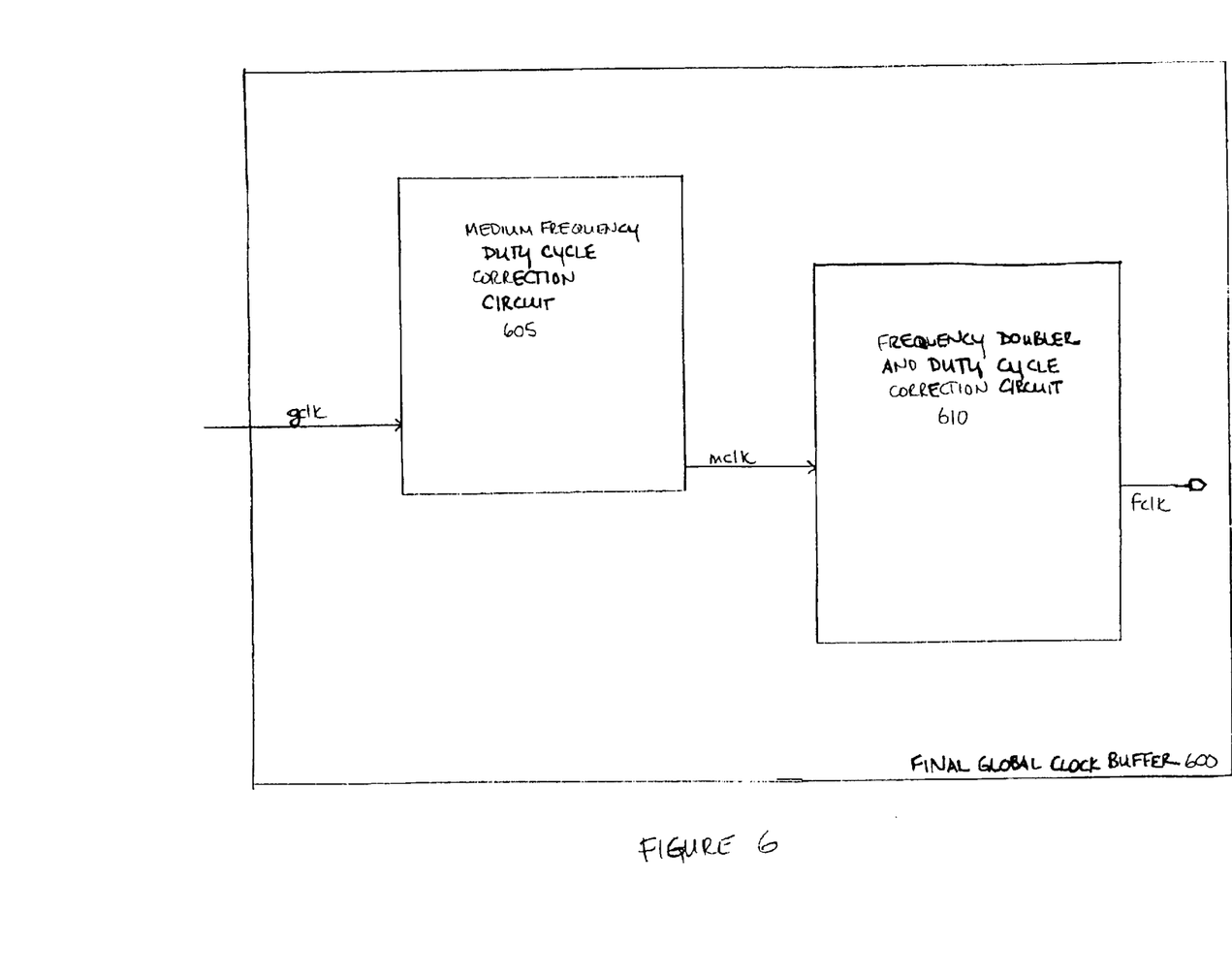
FIG. 6 is a block diagram showing one embodiment of a circuit that includes both the duty cycle correction circuit as shown in FIG. 5 and a frequency doubler and duty cycle correction circuit as shown in FIG. 2.

FIG. 6 is a block diagram of a final global clock buffer 600 of one embodiment in which both a duty cycle correction circuit 605 and a frequency doubler and duty cycle correction circuit 610 are used. The duty cycle correction circuit 605 is similar in operation and configuration to the circuit 500 of FIG. 5 while the frequency doubler and duty cycle correction circuit 610 is similar in operation and configuration to the circuit 200 of FIG. 2.

For the embodiment shown in FIG. 6, the circuit 605 performs the initial duty cycle correction on an input clock signal gclk received over a clock distribution network. The circuit 610 then receives the output mclk signal from the circuit 605 at an input, doubles the frequency of the input signal and performs duty cycle correction as described above on the double frequency signal.

By first correcting the input clock signal to the circuit 610 using the circuit 605, jitter on the fclk output signal from the circuit 610 may be reduced as compared to a final global clock buffer in which the circuit 610 is used alone. In this manner, the performance of the high frequency output clock signal fclk may be improved.

For some embodiments, referring to FIG. 1, all of the final global clock buffers 125 include the duty cycle correction circuit described in reference to FIG. 5. A smaller number of final global clock buffers includes the frequency doubler and duty cycle correction circuit described in reference to FIG. 2. Where the frequency doubler and duty cycle correction circuit is used, it may or may not be coupled to another duty cycle correction circuit.

It will be appreciated that the duty cycle correction and smart buffer circuits may be used for different applications than those described herein. For example, referring to FIG. 7, a frequency doubler and duty cycle correction 705 similar to the circuit 200 of FIG. 2, may be used to provide reference voltages (e.g. pref and nref) to control the delays of other clock signals (clk 0–clk 9 in FIG. 7, for example) provided by a clocking circuit 710. These other clock signals may, for example, be self-timed clock signals for which it is desirable to have the delay between clock signals stretch out as the clock cycle times increase.

Figure 7:
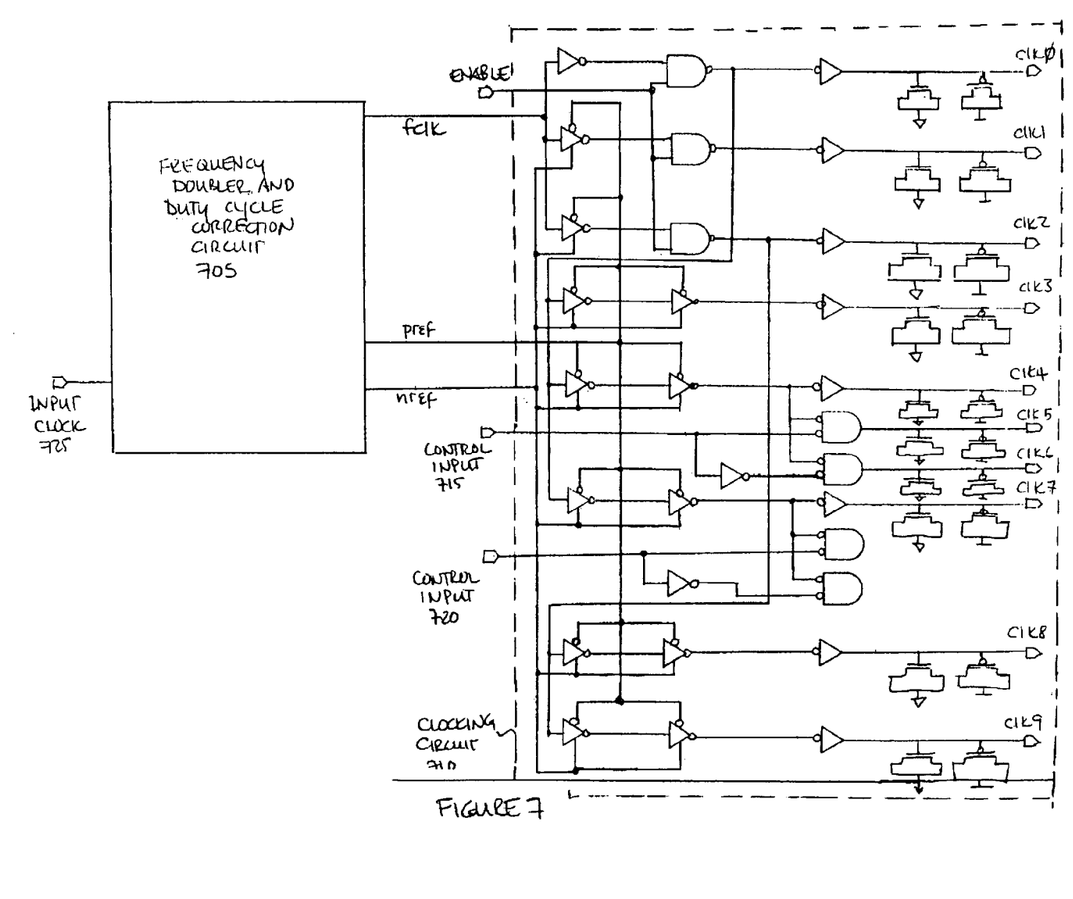
FIG. 7 is a schematic diagram illustrating an embodiment for which a frequency doubler and duty cycle correction circuit similar to that of FIG. 2 may be used to provide reference voltages to create variable delay clock signals.

The reference voltages pref and nref vary as a function of frequency. As the input clock cycle gets longer, the nref reference voltage is lower such that the n pull-down delay is longer. Similarly, for lower frequencies, the pref reference voltage is higher causing the p pull-up delay to be longer. In this manner, delays increase as the input clock cycle stretches out.

In the circuit of FIG. 7, the clocking circuit 710 receives the fclk signal from the frequency doubler and duty cycle correction circuit 705 as well as control input signals 715 and 720. These input signals are used to generate the clock signals clk0–clk9. The pref and nref reference voltages from the frequency doubler and duty cycle correction circuit 705 are received at control inputs of variable delay inverters such that pref and nref are used to control delays in generating the clock signals clk0–clk9. (The variable delay inverters of FIG. 7 may be constructed, for example, by combining the pull-up path of the inverter of FIG. 3 with the pull-down path of the inverter of FIG. 4.) In this manner, as the cycle of the input clock signal 725 stretches out at lower frequencies, the delays in the clock signals clk0–clk9 also stretch out.

The duty cycle correction circuit of various embodiments may be used in a similar manner with other types of clocking circuitry to perform a similar function.

Thus, the clock distribution and duty cycle correction circuitry of various embodiments may help to reduce duty cycle variations as compared to prior clock distribution and/or duty cycle correction approaches. By correcting the duty cycle at the endpoints of a clock distribution network, variations in temperature, devices, voltage, etc. across a chip can be corrected out before providing a local clock signal. Further, the duty cycle correction circuitry of various embodiments provides improved accuracy as compared to prior approaches. The duty cycle correction circuitry of various embodiments provides such capabilities while using a relatively small number of devices that can be configured in a relatively small area and while consuming relatively little power.

In the foregoing specification, the invention has been described with reference to specific exemplary embodiments thereof. It will, however, be appreciated that various modifications and changes may be made thereto without departing from the broader spirit and scope of the invention as set forth in the appended claims. For example, different device sizes, different types of variable delay inverters, different applications, etc. may be used for other embodiments. Further, the duty cycle correction circuitry of various embodiments may be used to provide output signals with duty cycles other than 50% duty cycles. For other duty cycles, for example, the threshold of the sense amplifier may be set for a different duty cycle by varying the device sizes and/or symmetry of the sense amplifier and/or by skewing inverter delays such that the high-to-low delay is different than the low-to-high delay. The specification and drawings are, accordingly, to be regarded in an illustrative rather than a restrictive sense.

What is claimed is:

1. An apparatus comprising:
   a clock distribution network to distribute a clock signal on an integrated circuit chip;
   a duty cycle correction circuit at a receiver in the clock distribution network; and frequency multiplying circuitry coupled to the duty cycle correction circuit, the frequency multiplying circuitry to receive a distributed clock signal received at the receiver at an input and provide an output clock signal having a frequency that is a multiple of the distributed clock signal, the duty cycle correction circuit to correct a duty cycle of the output clock signal and provide a duty-cycle-corrected output clock signal.

2. The apparatus of claim 1 wherein the duty cycle correction circuit includes a feedback path between an input and an output of the duty cycle correction circuit, the feedback path to control a delay of a circuit path in the duty cycle correction circuit to correct the duty cycle.

3. The apparatus of claim 2 wherein the duty cycle of the duty-cycle-corrected output clock signal is substantially equal to 50%.

4. The apparatus of claim 2 further including:

a sense amplifier in the feedback path, the sense amplifier having a threshold substantially equal to one half of a supply voltage (Vcc) to be coupled to the duty cycle correction circuit.

5. The apparatus of claim 4 further including:

a reset path between the input of the duty cycle correction circuit and the output of the duty cycle correction circuit, the reset path to control a width of the output clock signal.

6. The apparatus of claim 5 wherein the reset path and the feedback path is coupled to control a variable delay element.

7. The apparatus of claim 1 further including a smart buffer circuit coupled to an output of the duty cycle correction circuit, the smart buffer circuit to provide for proper operation of the duty cycle correction circuit over a range of loads to be coupled to the duty cycle correction circuit.

8. The apparatus of claim 7 wherein the smart buffer circuit is to match a delay of the duty-cycle-corrected output clock signal to a delay of a reference signal independent of a load coupled to the duty cycle correction circuit over the range of loads, the smart buffer circuit to adjust the delay of the duty-cycle-corrected output clock signal by adjusting the drive strength of an output driver in the duty cycle correction circuit.

9. The apparatus of claim 8 wherein the smart buffer includes a first phase detector to detect a difference in delay between one of a rising or falling edge of the duty-cycle-corrected output clock signal and a corresponding edge of the reference signal, the first phase detector to provide a first reference control signal at a first output, the first reference control signal to control a delay of a first delay element in the duty cycle correction circuit to adjust the drive strength of the driver for a first value of an input signal to the duty cycle correction circuit.

10. The apparatus of claim 9 wherein the smart buffer circuit further includes a second phase detector to detect a difference in d lay between a remaining one of a rising or falling edge of the duty-cycle-corrected output clock signal and a corresponding edge of the reference signal, the second phase detector to provide a second reference control signal at a second output, the second reference control signal to control a delay of a second delay element in the duty cycle correction circuit to adjust the drive strength of the output driver for a second value of the input signal to the duty cycle correction circuit.

11. The apparatus of claim 1 wherein the duty cycle correction circuit is to generate a reference voltage signal, a voltage of the reference voltage signal to vary in response to a change in frequency of the distributed clock signal, the apparatus further comprising, a clock generation circuit to receive the reference voltage signal and to provide an output clock signal, the clock generation circuit to very the delay of the output clock signal in response to a variation in voltage of the reference voltage signal.

12. The apparatus of claim 11 wherein the clock generation circuit is to provide multiple output clock signals, each of the multiple output clock signals to vary in response to a variation in the voltage of the reference voltage signal.

13. A clock distribution network comprising:

clock generation circuitry at a first location to generate a global clock signal;

clock distribution circuitry to distribute the global clock signal on an integrated circuit chip from the clock generation circuitry to a receiving point at a second, different location on the integrated circuit chip; and a duty cycle correction circuit at the receiving point to correct the duty cycle of the distributed global clock signal received via the clock distribution circuitry, wherein a frequency multiplying circuit is further coupled to the duty cycle correction circuit, the duty cycle correction circuit and the frequency multiplying circuit to work cooperatively to provide a multiplied, duty-cycle-corrected cutout clock signal.

14. The clock distribution network of claim 13 wherein the clock distribution circuitry is further to distribute the global clock signal from the clock generation circuitry to a plurality of receiving points and wherein each of the plurality of receiving points is coupled to an associated duty cycle correction circuit.

15. The clock distribution network of claim 13 wherein the duty cycle correction circuit includes a feedback path to control a delay of the output clock signal.

16. The clock distribution network of claim 15 wherein a signal communicated via the feedback path in the duty cycle correction circuit is to control at least one variable delay element in the duty cycle correction circuit.

17. The clock distribution network of claim 13 wherein the output clock signal has a substantially 50% duty cycle.

\* \* \* \* \*

UNITED STATES PATENT AND TRADEMARK OFFICE
CERTIFICATE OF CORRECTION

PATENT NO. : 6,750,689 B2
DATED : June 15, 2004
INVENTOR(S) : Fletcher et al.

It is certified that error appears in the above-identified patent and that said Letters Patent is hereby corrected as shown below:

Column 14,
Line 3, delete "d lay" and insert -- delay --.

Signed and Sealed this

Seventh Day of December, 2004

JON W. DUDAS
*Director of the United States Patent and Trademark Office*